United States Patent
Bilodeau et al.

(10) Patent No.: US 12,012,540 B2
(45) Date of Patent: Jun. 18, 2024

(54) COMPOSITIONS AND METHODS FOR SELECTIVELY ETCHING SILICON NITRIDE FILMS

(71) Applicant: ENTEGRIS, INC., Billerica, MA (US)

(72) Inventors: Steven M. Bilodeau, Fairfield, CT (US); Claudia Yevenes, White Plains, NY (US); Juhee Yeo, Suwon (KR)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 17/749,868

(22) Filed: May 20, 2022

(65) Prior Publication Data

US 2022/0389314 A1    Dec. 8, 2022

Related U.S. Application Data

(60) Provisional application No. 63/193,450, filed on May 26, 2021.

(51) Int. Cl.
| | |
|---|---|
| *C09K 13/06* | (2006.01) |
| *B81C 1/00* | (2006.01) |
| *C09K 13/04* | (2006.01) |
| *H01L 21/306* | (2006.01) |
| *H01L 21/311* | (2006.01) |
| *H01L 21/3213* | (2006.01) |

(52) U.S. Cl.
CPC .......... *C09K 13/06* (2013.01); *B81C 1/00539* (2013.01); *C09K 13/04* (2013.01); *H01L 21/30604* (2013.01); *H01L 21/311* (2013.01); *H01L 21/32134* (2013.01)

(58) Field of Classification Search
None
See application file for complete search history.

(56) References Cited

U.S. PATENT DOCUMENTS

| | | |
|---|---|---|
| 2017/0321121 A1 | 11/2017 | Yoo et al. |
| 2018/0337253 A1 | 11/2018 | Bilodeau |
| 2018/0346811 A1 | 12/2018 | Lee et al. |
| 2019/0074188 A1 | 3/2019 | Cooper |
| 2020/0157423 A1 | 5/2020 | Bilodeau |
| 2021/0108140 A1 | 4/2021 | Kim et al. |
| 2022/0033710 A1* | 2/2022 | Bilodeau ............. H01L 21/0217 |

FOREIGN PATENT DOCUMENTS

| | | | |
|---|---|---|---|
| KR | 20170093004 | * 8/2017 | ............. C09K 13/04 |
| WO | 2005092859 A1 | 10/2005 | |

OTHER PUBLICATIONS

Penta, N. K. et al., Use of anionic surfactants for selective polishing of silicon dioxide over silicon nitride films using colloidal silica-based slurries, Applied surface science, 2013, vol. 283, pp. 986-992.

* cited by examiner

*Primary Examiner* — Jiong-Ping Lu

(57) ABSTRACT

The invention relates to compositions and methods for the selective wet etching of a surface of a microelectronic device that contains both silicon nitride (SiN) and polysilicon. An etching composition as described comprises phosphoric acid, certain polysilicon corrosion inhibitors, along with certain silanes. The combination of the two components was found to greatly improve the selectivity of the silicon nitride etching composition in the presence of polysilicon.

14 Claims, 1 Drawing Sheet

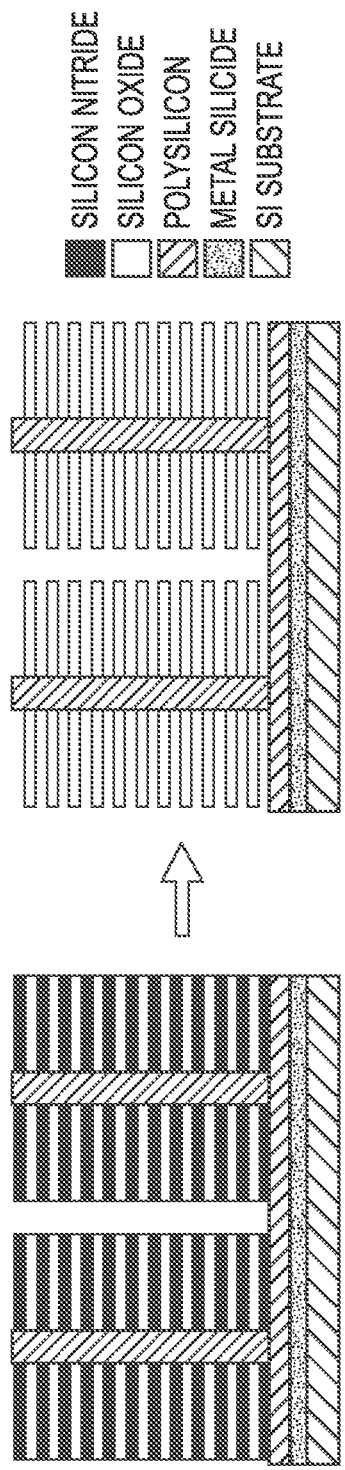

COMPOSITIONS AND METHODS FOR SELECTIVELY ETCHING SILICON NITRIDE FILMS

TECHNICAL FIELD

The invention relates generally to compositions and methods for selectively etching silicon nitride films in the presence of silicon oxide and polysilicon.

BACKGROUND

In the microelectronics industry, ongoing demand exists for improved device performance and for decreased device sizes and decreased device feature sizes. Reduced feature sizes provide dual advantages of increasing device feature density and increasing device speed.

Reducing feature and device sizes requires finding new ways to improve steps of the multi-step process of manufacturing microelectronic devices. In methods for preparing many types of microelectronic devices, a step of removing silicon nitride is common. A thin layer of silicon nitride ($Si_3N_4$), typically deposited by chemical vapor deposition from silane ($SiH_4$) and ammonia ($NH_3$), can be useful in a microelectronic device as a barrier for water and sodium. Also, patterned silicon nitride layers are used as a mask for spatially selective silicon oxide growth. After being applied, all or a portion of these silicon nitride materials may require removal, which is commonly performed by etching.

The removal of silicon nitride from a substrate by etching is advantageously performed in a manner that does not damage or disrupt other exposed or covered features of a microelectronic device. Often, a process of removing silicon nitride is performed in a manner that preferentially removes the silicon nitride relative to other materials that are also present at a surface of a microelectronic device substrate, such as silicon dioxide. According to various commercial methods, silicon nitride is removed from a microelectronic device surface by a wet etching process that involves exposing the substrate surface to concentrated phosphoric acid ($H_3PO_4$) at an elevated temperature, e.g., in a bath having a temperature in a range from 150° C. to 180° C. Conventional wet etching techniques for selectively removing silicon nitride relative to silicon oxide have used aqueous phosphoric acid ($H_3PO_4$) solutions, typically about 85 weight percent phosphoric acid and 15 weight percent water. Using fresh hot phosphoric acid, a typical $Si_3N_4$:$SiO_2$ selectivity can be about 40:1.

In further device structures, in addition to silicon oxide, exposed surfaces of polysilicon may also be present, which further complicates a desired selective silicon nitride etching process, insofar as aqueous phosphoric acid methods tend to cause corrosion of polysilicon surfaces. Thus, there is a need for compositions and methods useful for preferentially etching silicon nitride in the presence of polysilicon surfaces.

SUMMARY OF THE INVENTION

In summary, the invention relates to compositions and methods for the wet etching of a surface of a microelectronic device that contains silicon nitride (SiN) and polysilicon. Optionally, other materials are present such as a conductive material, a semiconducting material, or an insulating material useful in a microelectronic device, or a processing material that is useful in preparing a microelectronic device. Materials such as metal silicides may also be present but are often not exposed except in the case of defects such as cracks or lithography misalignment. An etching composition as described herein comprises phosphoric acid, certain polysilicon corrosion inhibitors, along with certain silanes. In one embodiment, the combination of the two inhibitor types was found to greatly improve the selectivity of the silicon nitride etching operation in the presence of polysilicon. In another embodiment, the combination of one inhibitor type and certain silicon-based additives also improved the silicon nitride etching while also reducing turbidity of the composition as applied.

BRIEF DESCRIPTION OF THE DRAWINGS

FIG. 1 is a depiction of an exemplary substrate, illustrating a before and after view of an etching step in the practice of the method of the invention.

DETAILED DESCRIPTION

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

The term "about" generally refers to a range of numbers that is considered equivalent to the recited value (e.g., having the same function or result). In many instances, the term "about" may include numbers that are rounded to the nearest significant figure.

Numerical ranges expressed using endpoints include all numbers subsumed within that range (e.g., 1 to 5 includes 1, 1.5, 2, 2.75, 3, 3.80, 4 and 5).

In one aspect, the invention provides a composition comprising: concentrated phosphoric acid, in an amount of at least 60 weight percent, based on the total weight of the composition; a compound chosen from chosen from linear and branched $C_8$-$C_{16}$ alkylbenzenesulfonic acids and $C_6$-$C_{12}$ alkyldiphenyl oxide disulfonic acids; and a compound of the formula $Si[phenyl\text{-}(-CH_2-)_x]_n(OR)_m$, wherein n is 1, 2, or 3, m is 1, 2, or 3, and the sum of n and m is 4, and x is 0, 1, 2 or 3, and wherein each R is independently chosen from $C_1$-$C_4$ alkyl.

In one embodiment, the invention provides a composition comprising: concentrated phosphoric acid, in an amount of at least 60 weight percent, based on the total weight of the composition; a compound chosen from chosen from linear and branched $C_8$-$C_{16}$ alkylbenzenesulfonic acids and $C_6$-$C_{12}$ alkyldiphenyl oxide disulfonic acids; a compound of the Formula (I):

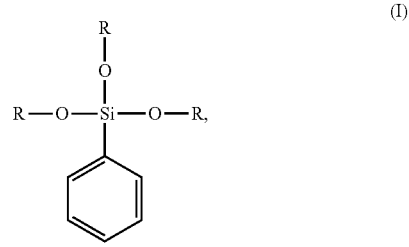

wherein each R is independently chosen from $C_1$-$C_4$ alkyl.

In one embodiment, R is methyl in Formula (I); i.e., the compound of formula (I) is phenyl trimethoxysilane.

In another aspect, the invention provides a composition comprising: concentrated phosphoric acid, in an amount of at least 60 weight percent, based on the total weight of the composition; a compound chosen from chosen from linear and branched $C_8$-$C_{16}$ alkylbenzenesulfonic acids and $C_6$-$C_{12}$ alkyldiphenyl oxide disulfonic acids; a compound chosen from:
i. N-(3-trimethoxysilylpropyl)diethylenetriamine;
ii. N-(2-aminoethyl)-3-aminopropyltriethoxy silane;
iii. N-(2-aminoethyl)-3-aminopropyl silane triol;
iv. $N^1$-(3-trimethoxysilylpropyl)diethylenetriamine;
v. N-(6-aminohexyl)aminopropyltrimethoxysilane;
vi. (3-aminopropyl)triethoxy-silane; and
vii. (3-aminopropyl)silane triol; and
a compound chosen from tetramethylammonium silicate and tetraethyl orthosilicate.

In one embodiment, the composition of this aspect further comprises 4-(3-phenylpropyl)pyridine.

In one embodiment of this aspect, the composition comprises (3-aminopropyl)silane triol; tetramethylammonium silicate; phosphoric acid; 4-(3-phenylpropyl)pyridine, dodecylbenzenesulfonic acid; and 4-octylbenzenesulfonic acid.

The compositions of the invention utilize at least one compound which functions as a polysilicon inhibitor during the selective etching of silicon nitride in the presence of polysilicon. In this regard, we have identified a number of compounds which can serve this goal of polysilicon corrosion inhibition, certain of which can be categorized as surfactants. In general, the polysilicon corrosion inhibitor compound is chosen from linear and branched $C_8$-$C_{16}$ alkylbenzenesulfonic acids and $C_6$-$C_{12}$ alkyldiphenyl oxide disulfonic acids. Examples include:

hexyl diphenyl oxide disulfonic acid (CAS No. 147732-59-0),
tetrapropyl-(sulfophenoxy)-benzenesulfonic acid (CAS No. 119345-03-8, also known as (a) benzene, 1,1-oxybis-, tetrapropylene derivatives, sulfonated and (b) 1,1'-oxybisbenzene tetrapropylene derivatives, sulfonated),
dodecylbenzenesulfonic acid (CAS No. 121-65-3), and
4-octylbenzenesulfonic acid (CAS No. 17012-98-5).

When these polysilicon corrosion inhibitor compounds are used in conjunction with a compound of the formula Si[phenyl-(—$CH_2$—)$_x$]$_n$(OR)$_m$ or a compound of Formula (I), the inhibition of corrosion of the polysilicon surface can be enhanced beyond that which is possible by utilizing either component alone. Thus, the compositions of the invention are useful as etching compositions in the selective etching or removal of silicon nitride films on certain microelectronic devices.

As used herein, the term "microelectronic device" (or "microelectronic device substrate," or simply "substrate") is used in a manner that is consistent with the generally understood meaning of this term in the electronics, microelectronics, and semiconductor fabrication arts, for example to refer to any of a variety of different types of: semiconductor substrates; integrated circuits; solid state memory devices; hard memory disks; read, write, and read-write heads and mechanical or electronic components thereof; flat panel displays; phase change memory devices; solar panels and other products that include one or more solar cell devices; photovoltaics; and microelectromechanical systems (MEMS) manufactured for use in microelectronic, integrated circuit, energy collection, or computer chip applications. It is to be understood that the term "microelectronic device" can refer to any in-process microelectronic device or microelectronic device substrate that contains or is being prepared to contain functional electronic (electrical-current-carrying) structures, functional semiconductor structures, and insulating structures, for eventual electronic use in a microelectronic device or microelectronic assembly.

As used herein, the term "silicon nitride" is given a meaning that is consistent with the meaning of the term as used in the microelectronics and semiconductor fabrication industries. Consistent therewith, silicon nitride refers to materials including thin films made of amorphous silicon nitride with commercially useful low levels of other materials or impurities and potentially some variation around the nominal stoichiometry of $Si_3N_4$. The silicon nitride may be present as part of a microelectronic device substrate as a functioning feature of the device, for example as a barrier layer or an insulating layer, or may be present to function as a material that facilitates a multi-step fabrication method for preparing a microelectronic device.

As used herein, the term "silicon oxide" is given a meaning that is consistent with the meaning of the term as used in the microelectronics and semiconductor fabrication industries. Consistent therewith, silicon oxide refers to thin films made of silicon oxide ($SiO_x$), e.g., $SiO_2$, "thermal oxide" (Th$O_x$), and the like. The silicon oxide can be placed on the substrate by any method, such as by being deposited by chemical vapor deposition from TEOS or another source, or by being thermally deposited. The silicon oxide can advantageously contain a commercially useful low level of other materials or impurities. The silicon oxide may be present as part of a microelectronic device substrate as a feature of the microelectronic device, for example as an insulating layer.

As used herein, "polysilicon" or polycrystalline Si or poly-Si is understood by the person skilled in the art to be a polycrystalline form of silicon consisting of multiple small silicon crystals. It is typically deposited using low-pressure chemical vapor deposition (LPCVD) and is often doped n-type polysilicon or p-type polysilicon. The extent of doping can vary from lightly doped (e.g., in a range from $10^{13}$ $cm^{-3}$ to $10^{18}$ $cm^{-3}$) to heavily doped (e.g., greater than $10^{18}$ $cm^{-3}$), as readily understood by the person skilled in the art. Examples of p-doped material include polysilicon doped with a dopant species from Group IIIA of the Periodic Table, such as boron, aluminum, gallium and/or indium. An n-doped material may for example be polysilicon doped with a dopant species from Group IV (silicon, germanium, or tin) or Group V (phosphorus, arsenic, antimony, or bismuth) of the Periodic Table.

Embodiments of certain etching compositions include compositions in the form of aqueous solutions that comprise, consist essentially of, or consist of: aqueous phosphoric acid (e.g., concentrated phosphoric acid and an optional an amount of added water); a polysilicon corrosion inhibitor compound; and a compound of the formula Si(phenyl)$_n$(OR)$_m$ or a compound of Formula (I) in an amount effective to improve etch rate of silicon nitride or selectivity of silicon nitride relative to polysilicon; and optionally a fluoride compound in amounts that are effective to produce desired etching (including a useful or advantageous etch rate) of silicon nitride and/or optionally dissolved silica. These and other example compositions can comprise, consist of, or consist essentially of the recited ingredients and optional ingredients. As a general convention throughout the present description a composition of matter such as an etching composition as described, or an ingredient or component thereof, that is said to "consist essentially of" a group of specified ingredients or materials refers to a composition that contains the specified ingredients or materials with not more than a low or insignificant amount of other ingredients or materials, e.g., not more than 5, 2, 1, 0.5, 0.1, or 0.05 parts by weight of other ingredients or materials. For example, an etching composition that contains materials that consist essentially of: aqueous phosphoric acid; a polysilicon corrosion inhibitor compound; a compound of the formula $Si(phenyl)_n(OR)_m$ or a compound of Formula (I); and optional ingredients as described, means an etching composition that contains these ingredients and not more than 5, 2, 1, 0.5, 0.1, or 0.05 parts by weight of any other dissolved or un-dissolved material or materials (individually or as a total) other than the identified materials.

The etching composition includes aqueous phosphoric acid (e.g., concentrated phosphoric acid) in an amount that is effective to produce desired etching of silicon nitride. The term "aqueous phosphoric acid" refers to an ingredient of the etching composition that is mixed or combined with other ingredients of the etching composition to form the etching composition. The term "phosphoric acid solids" refers to the non-aqueous component of an aqueous phosphoric acid ingredient, or of an etching composition that is prepared from aqueous phosphoric acid ingredient.

The amount of phosphoric acid solids contained in an etching composition can be an amount that, in combination with the other materials of an etching composition, will provide desired etching performance, including desired silicon nitride etch rate and selectivity, which typically requires a relatively high amount (concentration) of phosphoric acid solids. For example, an etching composition can contain an amount of phosphoric acid solids that is at least about 50 weight percent based on total weight of the etching composition, e.g., at least 70, or at least about 80 or 85 weight percent phosphoric acid solids based on total weight of the etching composition.

To provide a desired amount of phosphoric acid solids, the composition may contain "concentrated" phosphoric acid as an ingredient that is mixed or combined with other ingredients (one ingredient optionally being water, in some form) to produce the etching composition. "Concentrated" phosphoric acid refers to an aqueous phosphoric acid ingredient that contains a high or maximum amount of phosphoric acid solids in the presence of a low or minimum amount of water and substantially no other ingredients (e.g., less than 0.5 or 0.1 weight percent of any non-water or non-phosphoric acid solids materials). Concentrated phosphoric acid can typically be considered to have at least about 80 or 85 weight percent phosphoric acid solids in about 15 or 20 weight percent water. Alternately, the etching composition may be considered to include an amount of concentrated phosphoric acid that is diluted with water, meaning for example concentrated phosphoric acid that has been diluted with an amount of water before or after being combined with other ingredients of the etching composition, or an equivalent formed in any manner. As another alternative, an ingredient of the etching composition can be concentrated phosphoric acid or a diluted phosphoric acid, and the etching composition can contain an additional amount of water that is provided to the etching composition either as a component of a different ingredient or as a separate water ingredient.

As an example, if concentrated phosphoric acid is used to form the composition, the amount of concentrated phosphoric acid (85 weight percent, in water) can be an amount that is at least 60, e.g., at least 80 or at least 90, 93, 95, or at least 98 weight percent of the etching composition, based on total weight etching composition.

As used herein, the term "fluoride compound" refers to certain etchants which are optionally added to increase the etch rate of the silicon nitride. Such compounds include, but are not limited to, HF, ammonium fluoride, tetrafluoroboric acid, hexafluorosilicic acid, other compounds containing B—F or Si—F bonds, tetrabutylammonium tetrafluoroborate (TBA-BF$_4$), tetraalkylammonium fluoride (NR$_1$R$_2$R$_3$R$_4$F), and combinations thereof. In one embodiment, the fluoride compound is chosen from HF, ammonium fluoride, tetrafluoroboric acid, hexafluorosilicic acid, tetrabutylammonium tetrafluoroborate, tetra(C$_1$-C$_6$ alkyl)ammonium fluorides, and combinations thereof.

The amount of the optional fluoride compound contained in the compositions of the invention can be an amount that, in combination with the other materials of an etching composition, will provide desired etching performance, including desired silicon nitride etch rate and selectivity. For example, an etching composition can contain an amount of a fluoride source compound in a range from about 5 to 10,000 or even up to 50,000 parts per million (i.e., from 0.0005 to 1 or even 5 weight percent) based on total weight of the etching composition, such as from about 20 to 2,000 parts per million (i.e., from 0.002 to 0.2 weight percent) based on total weight of the etching composition. In certain embodiments, the compositions are devoid or substantially devoid of such fluoride compounds. "Substantially devoid" as used herein is defined in certain embodiments as less than 2 weight percent, less than 1 weight percent, less than 0.5 weight percent, or less than 0.1 weight percent. "Devoid" as used herein is intended in certain embodiments to correspond to less than 0.001 weight percent to account for environmental contamination, and in another embodiment, 0.0 weight percent.

Optionally, the compositions of the invention can further comprise an amount of silica dissolved in the phosphoric acid ("added silica"), e.g., by dissolving solid silica material in the phosphoric acid or by adding a soluble silicon-containing compound that can form dissolved silica by reaction with aqueous phosphoric acid, examples of such compounds including (a) TMAS (tetramethylammonium silicate), (b) tetraacetoxysilane, or (c) a tetraalkoxysilane such as tetramethoxysilane, tetraethoxysilane, or the like. The dissolved silica may be effective to improve selectivity of an etching composition toward silicon nitride. The amount may be any useful amount that does not lead to pre-processing silica supersaturation at conditions of an etching process, such as from about 5 to 10,000 parts per million dissolved silica or soluble silicon-containing compound based on total weight of the etching composition, or from about 20 to 5,000, 3,000, 1,000, or 500 parts per million based on total weight of the etching composition.

In certain embodiments, the compositions of the invention can further comprise at least one silane chosen from (a) alkylamino alkoxysilanes and (b) alkylamino hydroxyl silanes, wherein the silane possesses at least one moiety chosen from alkoxy and hydroxyl. In one embodiment, the alkylamino alkoxysilane and alkylamino hydroxyl silane compounds are chosen from

- N-(3-trimethoxysilylpropyl)diethylenetriamine (CAS Number 35141-30-1);
- N-(2-aminoethyl)-3-aminopropyltriethoxy silane (CAS No. 5089-72-5);
- N-(2-aminoethyl)-3-aminopropyl silane triol (CAS No. 1760-24-3);
- N$^1$-(3-trimethoxysilylpropyl)diethylenetriamine (CAS No. 35141-30-1);

N-(6-aminohexyl)aminopropyltrimethoxysilane (CAS No. 51895-58-0);

(3-aminopropyl)triethoxy-silane (CAS No. 919-30-2), also known as "APTES"; and (3-aminopropyl)silane triol (CAS No. 58160-99-9), also known as "APST".

The etching composition can contain water from one or from multiple sources. For example, water will be present in an aqueous phosphoric acid ingredient. Additionally, water may be used as a carrier for one or more of the other ingredients of the composition, and water may be added alone as its own ingredient. The amount of water should be sufficiently low to allow the composition to exhibit desired or preferred or advantageous performance properties, including a useful (sufficiently high) silicon nitride etch rate. An increase in the presence of water tends to increase the etch rate of silicon nitride but can also depress the boiling point of the composition, which forces a reduction in operating temperature of the composition and an opposite effect. Examples of amounts of water, from all sources, in an etching composition, can be less than about 50, 40, or 30 weight percent, for example in a range from about 5 weight percent to about 25 percent by weight, based on total weight of the etching composition, or in a range from about 10 to 20 weight percent water based on total weight of the etching composition.

In certain embodiments, the compositions of the invention do not require and may exclude other types of ingredients not typically included in an etching composition, such as a pH adjusting agent and solid materials such as abrasive.

The compositions of the invention can be prepared by any method that will be useful to produce an etching composition as described. By one method, aqueous or solid ingredients can be combined, optionally with heat, and mixed to uniformity.

As noted above, the compositions as described can be useful for methods of removing silicon nitride from a surface of a microelectronic device substrate. The substrate can contain other materials that are useful in a microelectronic device, such as one or more of an insulator, barrier layer, conducting material, semiconducting material, or a material that is useful for processing a microelectronic device (e.g., photoresist, mask, among others). Example substrates have a surface that includes silicon nitride, thermal oxide (ThOx) and PETEOS (oxide deposited using plasma enhanced tetraethyl ortho silicate) as well as polysilicon.

In use, the compositions of the invention can provide etching performance that is useful based on commercial performance needs and expectations, and as compared to comparative etching compositions, can provide improved performance with respect to etch rate and selectivity of silicon nitride relative to polysilicon.

Accordingly, in another aspect, the invention provides a method of etching a silicon nitride surface on a microelectronic device substrate, said substrate comprising a surface comprising polysilicon, the method comprising:
providing a composition comprising: concentrated phosphoric acid, in an amount of at least 60 weight percent, based on the total weight of the composition; a compound chosen from chosen from linear and branched $C_8$-$C_{16}$ alkylbenzenesulfonic acids and $C_6$-$C_{12}$ alkyldiphenyl oxide disulfonic acids; and a compound of the formula Si[phenyl-(—$CH_2$—)$_x$]$_n$(OR)$_m$, wherein n is 1, 2, or 3, m is 1, 2, or 3, and the sum of n and m is 4, and x is 0, 1, 2 or 3, and wherein each R is independently chosen from $C_1$-$C_4$ alkyl; providing a substrate having a surface comprising silicon nitride and a surface comprising polysilicon, and contacting the substrate with the composition under conditions effective to etch silicon nitride.

In one embodiment, the invention provides a method of etching a silicon nitride surface on a microelectronic device substrate, said substrate comprising a surface comprising polysilicon, the method comprising:
providing a composition comprising: concentrated phosphoric acid, in an amount of at least 60 weight percent, based on the total weight of the composition; a compound chosen from chosen from linear and branched $C_8$-$C_{16}$ alkylbenzenesulfonic acids and $C_6$-$C_{12}$ alkyldiphenyl oxide disulfonic acids; and a compound of the Formula (I):

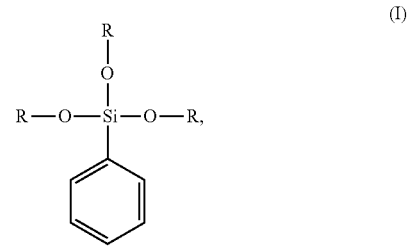

wherein each R is independently chosen from $C_1$-$C_4$ alkyl;
providing a substrate having a surface comprising silicon nitride and a surface comprising polysilicon, and contacting the substrate with the composition under conditions effective to etch silicon nitride.

In another aspect, the invention provides a method of etching a silicon nitride surface on a microelectronic device substrate, said substrate comprising a surface comprising polysilicon, the method comprising:
providing a composition comprising: concentrated phosphoric acid, in an amount of at least 60 weight percent, based on the total weight of the composition; a compound chosen from chosen from linear and branched $C_8$-$C_{16}$ alkylbenzenesulfonic acids and $C_6$-$C_{12}$ alkyldiphenyl oxide disulfonic acids; a compound chosen from:
i. N-(3-trimethoxysilylpropyl)diethylenetriamine;
ii. N-(2-aminoethyl)-3-aminopropyltriethoxy silane;
iii. N-(2-aminoethyl)-3-aminopropyl silane triol;
iv. $N^1$-(3-trimethoxysilylpropyl)diethylenetriamine;
v. N-(6-aminohexyl)aminopropyltrimethoxysilane;
vi. (3-aminopropyl)triethoxy-silane; and
vii. (3-aminopropyl)silane triol; and
a compound chosen from tetramethylammonium silicate and tetraethyl orthosilicate;
providing a substrate having a surface comprising silicon nitride and a surface comprising polysilicon, and contacting the substrate with the composition under conditions effective to etch silicon nitride.

This silicon nitride etching operation is effective in at least partially removing silicon nitride on a surface of a microelectronic device substrate. The phrase "at least partially remove" corresponds to a removal of at least about 85% of the silicon nitride present on the device prior to particle removal, at least 90%, at least 95%, or at least about 99%.

This method can be performed on known and commercially available equipment. Generally, to etch a substrate to selectively remove a material at a surface of the substrate, etching composition can be applied to the surface and allowed to contact surface structures to selectively remove certain of the structures, chemically.

Silicon nitride films occasionally have a thin oxidized surface that can inhibit the etching process, since the composition is designed to etch oxide very slowly. In such cases, a very brief treatment with dilute HF can be an advantageous first process step.

In an etching step, the composition can be applied to the surface in any suitable manner, such as by spraying the composition onto the surface; by dipping (in a static or dynamic volume of the composition) the substrate into etching composition; by contacting the surface with another material, e.g., a pad, or fibrous sorbent applicator element, that has etching composition absorbed thereon; by contacting the substrate with an amount of the etching composition in a circulating pool; or by any other suitable means, manner or technique, by which the etching composition is brought into removal contact with the surface of the microelectronic substrate that contains silicon-germanium and silicon. The application may be in a batch or single wafer apparatus, for dynamic or static cleaning.

The conditions (e.g., time and temperature) of a useful etching process can be any that are found to be effective or advantageous. Generally, etching composition is contacted with the surface, such as by submersion in a bath of the etching composition, for a time that is sufficient to selectively remove silicon nitride. The time of exposure to the etching composition and the temperature of the etching composition can be effective for a desired amount of removal of the silicon nitride from a surface of the substrate. The amount of time for an etching step should not be too short, because this means that an etch rate of silicon nitride may be too high, which can lead to process control difficulties and reduced quality of a microelectronic device at the end of an etch step. Of course, the amount of time required for an etch step is preferably not unduly long, to allow good efficiency and throughput of an etching process and semiconductor fabrication line. Examples of useful times for an etching step may be in a range from about 5 minutes to about 300 minutes, or about 10 minutes to about 60 minutes, at a temperature in a range of from about 100° C. to about 180° C. Such contacting times and temperatures are illustrative, and any other suitable time and temperature conditions may be employed that are efficacious to achieve the required removal selectivity.

An etching step of the present description can be useful to etch silicon nitride material from a surface of any type of substrate. According to particular embodiments, a substrate can include alternating thin film layers of silicon nitride as structural features of a substrate that includes alternating thin film layers of the silicon nitride layers with silicon oxide as well as polysilicon, conductive metal silicides and dielectrics such as zirconium oxide or aluminum oxide. The substrate before the etch step includes the alternating layers of silicon nitride positioned in openings between high aspect ratio silicon oxide structures. The etch step removes the silicon nitride to leave behind the silicon oxide layers, as shown as the right-side substrate of FIG. 1, with openings or "slits" separating the silicon oxide layers. According to the present description, an etching process can be used as illustrated at FIG. 1 to etch a substrate shown at FIG. 1. Example etching processes can exhibit a significantly increased SiN etch rate, good selectivity relative to silicon oxide of greater than about 150, or 200, or 300 and in certain embodiments, at least about 2000, and avoidance of major silica redeposition (as evidenced by closure or near-closure of the slit openings), as compared to prior art and comparable etching compositions and etching processes.

After completion of a desired amount of selective etching of silicon nitride, etching composition that remains on a surface of an etched microelectronic device can be removed from the surface by any desired and useful method, such as by a rinse, wash, or other removal step, using water (or optionally phosphoric acid followed by water). For example, after etching, a microelectronic device substrate may be rinsed with a rinse of deionized water (e.g., at a temperature in a range from about 20 to about 90 degrees Celsius) followed by drying, e.g., spin-dry, $N_2$, vapor-dry etc. Following the rinse, the substrate surface may be measured for the presence and amount of particles at the surface.

The compositions described herein can be easily formulated by simple addition of the respective ingredients and mixing to homogeneous condition. Furthermore, the compositions may be readily formulated as single-package formulations or multi-part formulations that are mixed at or before the point of use, preferably multi-part formulations. The individual parts of the multi-part formulation may be mixed at the tool or in a mixing region/area such as an inline mixer or in a storage tank upstream of the tool. It is contemplated that the various parts of the multi-part formulation may contain any combination of ingredients/constituents that when mixed together form the desired composition. The concentrations of the respective ingredients may be widely varied in specific multiples of the semi-aqueous composition, i.e., more dilute or more concentrated, and it will be appreciated that the semi-aqueous compositions can variously and alternatively comprise, consist or consist essentially of any combination of ingredients consistent with the disclosure herein.

Accordingly, in third aspect, the invention provides a kit including, in one or more containers, one or more components adapted to form the compositions described herein. The containers of the kit must be suitable for storing and shipping said semi-aqueous composition components, for example, NOWPak® containers (Advanced Technology Materials, Inc., Danbury, Conn., USA). The one or more containers which contain the components of the composition preferably include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended composition to a process tool.

Substantially chemically inert, impurity-free, flexible and resilient polymeric film materials, such as high density polyethylene, can be used to fabricate the liners for said one or more containers. Desirable liner materials are generally processed without requiring co-extrusion or barrier layers, and without any pigments, UV inhibitors, or processing agents that may adversely affect the purity requirements for components to be disposed in the liner. A listing of desirable liner materials include films comprising virgin (additive-free) polyethylene, virgin polytetrafluoroethylene (PTFE), polypropylene, polyurethane, polyvinylidene chloride, polyvinylchloride, polyacetal, polystyrene, polyacrylonitrile, polybutylene, and so on. Preferred thicknesses of such liner materials are in a range from about 5 mils (0.005 inch) to about 30 mils (0.030 inch), as for example a thickness of 20 mils (0.020 inch).

Regarding the containers for the kits, the disclosures of the following patents and patent applications are hereby incorporated herein by reference in their respective entireties: U.S. Pat. No. 7,188,644 entitled "APPARATUS AND METHOD FOR MINIMIZING THE GENERATION OF PARTICLES IN ULTRAPURE LIQUIDS;" and U.S. Pat. No. 6,698,619 entitled "RETURNABLE AND REUSABLE, BAG-IN-DRUM FLUID STORAGE AND DISPENSING CONTAINER SYSTEM".

EXAMPLES

Formulation Composition in Weight Percent

| Example | 3-APST | H$_3$PO$_4$ | DIW | TMAS | PTMOS | DBA-40 | Total | Doped polysilicon* ER (nm/minute) |
|---|---|---|---|---|---|---|---|---|
| A | 3.9357 | 73.9481 | 21.8800 | 0.0270 | 0.2080 | 0.0012 | 100 | 0.130 |
| B | 3.9357 | 73.8249 | 21.8600 | 0.0270 | 0.3500 | 0.0024 | 100 | 0.103 |
| C | 3.9357 | 73.9469 | 21.8800 | 0.0270 | 0.2080 | 0.0024 | 100 | 0.130 |
| D | 3.9357 | 73.8261 | 21.8600 | 0.0270 | 0.3500 | 0.0012 | 100 | 0.238 |
| E | 2.6240 | 76.5278 | 20.6210 | 0.0180 | 0.2080 | 0.0012 | 100 | 0.242 |
| F | 2.6240 | 76.4056 | 20.6010 | 0.0180 | 0.3500 | 0.0014 | 100 | 0.200 |
| G | 3.9357 | 74.1738 | 21.8600 | 0.0270 | 0.0000 | 0.0035 | 100 | 0.171 |
| H | 3.9357 | 74.1773 | 21.8600 | 0.0270 | 0.0000 | 0.0000 | 100 | TBD |
| I | 3.9357 | 73.9693 | 21.8600 | 0.0270 | 0.2080 | 0.0000 | 100 | TBD |
| J | 0.0000 | 85.0000 | 15.0000 | 0.0000 | 0.0000 | 0.0000 | 100 | TBD |

Legend:
3-APST = (3-aminopropyl)trimethoxy silane (CAS No. 58160-99-9)
DIW = deionized water
TMAS = tetramethylammonium silicate (CAS No. 53116-81-7)
PTMOS = phenyltrimethoxysilane (CAS No. 2996-92-1)
DBA-40 = Tetrapropyl-(sulfophenoxy)-benzenesulfonic acid (CAS No. 119345-03-8),
*Highly phosphorous-doped poly silicon etch rate Example K Composition:
  27.5 weight percent (3-aminopropyl)silane triol
  18 weight percent tetramethylammonium silicate
  89% phosphoric acid
  0.5 weight percent 4-(3-phenylpropyl)pyridine
  5 weight percent of 0.5% dodecylbenzylsulfonic acid in phosphoric acid
  0.15 weight percent 4-octylbenzylsulfonic acid
Etch Rate Results:
  SiNx 123.1 (Å/minute)
  SiOx 0.23 (Å/minute)
  *Doped polysilicon 0.10 (Å/minute)

Highly phosphorous-doped polysilicon was first exposed to a 100:1 HF solution for 60 seconds to remove the surface oxide. It was then exposed to the selective silicon nitride formulations at 160° C. for 30 minutes and rinsed in hot deionized water. The polysilicon thickness was measured before and after processing using spectroscopic ellipsometry.

These formulations required water to be boiled off to reach 160° C. Alternatively, the formulations could be fabricated using less water.

Examples 1-9

| Example | 3-APST | H$_3$PO$_4$ | TMAS | PPP | DDBSA | OBSA | Condition | Poly Si |
|---|---|---|---|---|---|---|---|---|
| 1 | 8.33 | 79.59 | 0.98 | 1 | 10 | 0.10 | Clear | ⊚ |
| 2 | 8.33 | 85.14 | 0.98 | 0.5 | 5 | 0.05 | Clear | Δ |
| 3 | 8.33 | 84.14 | 0.98 | 1.5 | 5 | 0.05 | Clear | Δ |
| 4 | 8.33 | 75.14 | 0.98 | 0.5 | 15 | 0.05 | Turbid | ⊚ |
| 5 | 8.33 | 74.14 | 0.98 | 1.5 | 15 | 0.05 | Turbid | ○ |
| 6 | 8.33 | 85.04 | 0.98 | 0.5 | 5 | 0.15 | Clear | ⊚ |
| 7 | 8.33 | 84.04 | 0.98 | 1.5 | 5 | 0.15 | Clear | ○ |
| 8 | 8.33 | 75.04 | 0.98 | 0.5 | 15 | 0.15 | Clear | ⊚ |
| 9 | 8.33 | 74.04 | 0.98 | 1.5 | 15 | 0.15 | Clear | ○ |

Legend:
⊚: High suppression of Poly Si
○: good
Δ: Slightly effective
DDBSA: dodecylbenzylsulfonic acid
OBSA: 4-octylbenzylsulfonic acid Polysilicon Etch Rate Study Conditions: 160° C.; SiNx and SiOx 1800 seconds; Poly Si is 7000 seconds.

Aspects

In a first aspect, the invention provides a composition comprising:
  a. concentrated phosphoric acid, in an amount of at least 60 weight percent, based on the total weight of the composition;
  b. a compound chosen from chosen from linear and branched $C_8$-$C_{16}$ alkylbenzenesulfonic acids and $C_6$-$C_{12}$ alkyldiphenyl oxide disulfonic acids; and
  c. a compound of the formula Si[phenyl-($-CH_2-$)$_x$]$_n$ (OR)$_m$, wherein n is 1, 2, or 3, m is 1, 2, or 3, and the sum of n and m is 4, and x is 0, 1, 2 or 3, and wherein each R is independently chosen from $C_1$-$C_4$ alkyl.

In a second aspect, the invention provides the composition of the first aspect, wherein each R is methyl.

In a third aspect, the invention provides the composition of the first aspect, wherein n is 1.

In a fourth aspect, the invention provides the composition of the first aspect, wherein b. is chosen from
  hexyl diphenyl oxide disulfonic acid;
  tetrapropyl-(sulfophenoxy)-benzenesulfonic acid;
  dodecylbenzenesulfonic acid; and
  4-octylbenzenesulfonic acid.

In a fifth aspect, the invention provides the composition of any one of the first through fourth aspects, further comprising added silica.

In a sixth aspect, the invention provides the composition of any one of the first through fourth aspects, further comprising at least one silane chosen from (a) alkylamino alkoxysilanes and (b) alkylamino hydroxyl silanes, wherein the silane possesses at least one moiety chosen from alkoxy and hydroxyl.

In a seventh aspect, the invention provides the composition of any one of the first through fourth aspects, further comprising a compound chosen from
  N-(3-trimethoxysilylpropyl)diethylenetriamine;
  N-(2-aminoethyl)-3-aminopropyltriethoxy silane;
  N-(2-aminoethyl)-3-aminopropyl silane triol;
  $N^1$-(3-trimethoxysilylpropyl)diethylenetriamine;
  N-(6-aminohexyl)aminopropyltrimethoxysilane;
  (3-aminopropyl)triethoxy-silane; and
  (3-aminopropyl)silane triol.

In an eighth aspect, the invention provides the composition of any one of the first through fourth aspects, further comprising tetramethylammonium silicate and (3-aminopropyl) silane triol.

In a ninth aspect, the invention provides the composition of any one of the first through fourth aspects, further comprising tetramethylammonium silicate.

In a tenth aspect, the invention provides a composition comprising:
  a. concentrated phosphoric acid, in an amount of at least 60 weight percent, based on the total weight of the composition;
  b. a compound chosen from chosen from linear and branched $C_8$-$C_{16}$ alkylbenzenesulfonic acids and $C_6$-$C_{12}$ alkyldiphenyl oxide disulfonic acids; and
  c. a compound of the formula

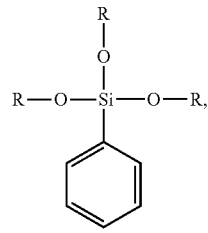

wherein each R is independently chosen from $C_1$-$C_4$ alkyl.

In an eleventh aspect, the invention provides the composition of the tenth aspect, wherein each R is methyl.

In a twelfth aspect, the invention provides the composition of the tenth or eleventh aspects, wherein b. is chosen from
  hexyl diphenyl oxide disulfonic acid;
  tetrapropyl-(sulfophenoxy)-benzenesulfonic acid;
  dodecylbenzenesulfonic acid; and
  4-octylbenzenesulfonic acid.

In a thirteenth aspect, the invention provides the composition of any one of the tenth, eleventh, or twelfth aspects, further comprising a compound chosen from
  N-(3-trimethoxysilylpropyl)diethylenetriamine;
  N-(2-aminoethyl)-3-aminopropyltriethoxy silane;
  N-(2-aminoethyl)-3-aminopropyl silane triol;
  $N^1$-(3-trimethoxysilylpropyl)diethylenetriamine;
  N-(6-aminohexyl)aminopropyltrimethoxysilane;
  (3-aminopropyl)triethoxy-silane; and
  (3-aminopropyl)silane triol.

In a fourteenth aspect, the invention provides the composition of any one of the tenth, eleventh, or twelfth aspects, further comprising tetramethylammonium silicate and (3-aminopropyl) silane triol.

In a fifteenth aspect, the invention provides a method of etching a silicon nitride surface on a microelectronic device substrate, said substrate comprising a surface comprising polysilicon, the method comprising:
  providing a composition comprising:
    a. concentrated phosphoric acid, in an amount of at least 60 weight percent, based on the total weight of the composition;
    b. a compound chosen from chosen from linear and branched $C_8$-$C_{16}$ alkylbenzenesulfonic acids and $C_6$-$C_{12}$ alkyldiphenyl oxide disulfonic acids; and
    c. a compound of the formula Si[phenyl-($-CH_2-$)$_x$]$_n$ (OR)$_m$, wherein n is 1, 2, or 3, m is 1, 2, or 3, and the sum of n and m is 4, and x is 0, 1, 2 or 3, and wherein each R is independently chosen from $C_1$-$C_4$ alkyl;
  providing a substrate having a surface comprising silicon nitride and a surface comprising polysilicon, and contacting the substrate with the composition under conditions effective to etch silicon nitride.

In a sixteenth aspect, the invention provides the method of the fifteenth aspect, wherein R is methyl.

In a seventeenth aspect, the invention provides the method of the fifteenth or sixteenth aspect, wherein b. is chosen from
  hexyl diphenyl oxide disulfonic acid;
  dodecyl diphenyl oxide disulfonic acid;
  dodecylbenzenesulfonic acid; and
  4-octylbenzenesulfonic acid.

In an eighteenth aspect, the invention provides the method of any one of the fifteenth, sixteenth, or seventeenth aspect, wherein c. is a compound of the formula

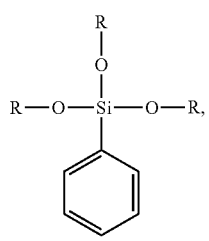

wherein each R is chosen from $C_1$-$C_4$ alkyl.

In a nineteenth aspect, the invention provides the method of any one of the fifteenth through eighteenth aspects, wherein each R is methyl.

In a twentieth aspect, the invention provides the method of any one of the fifteenth through nineteenth aspects, wherein b. is chosen from
hexyl diphenyl oxide disulfonic acid;
tetrapropyl-(sulfophenoxy)-benzenesulfonic acid;
dodecylbenzenesulfonic acid; and
4-octylbenzenesulfonic acid.

In a twenty-first aspect, the invention provides the method of any one of the fifteenth through twentieth aspects, further comprising at least one silane chosen from (a) alkylamino alkoxysilanes and (b) alkylamino hydroxyl silanes, wherein the silane possesses at least one moiety chosen from alkoxy and hydroxyl.

In a twenty-second aspect, the invention provides the method of any one of the fifteenth through twentieth aspects, further comprising a compound chosen from
N-(3-trimethoxysilylpropyl)diethylenetriamine;
N-(2-aminoethyl)-3-aminopropyltriethoxy silane;
N-(2-aminoethyl)-3-aminopropyl silane triol;
$N^1$-(3-trimethoxysilylpropyl)diethylenetriamine;
N-(6-aminohexyl)aminopropyltrimethoxysilane;
(3-aminopropyl)triethoxy-silane; and
(3-aminopropyl)silane triol.

In a twenty-third aspect, the invention provides the method of any one of the fifteenth through twentieth aspects, further comprising added silica.

In a twenty-fourth aspect, the invention provides the method of the fifteenth aspect, further comprising tetramethylammonium silicate and (3-aminopropyl) silane triol.

In a twenty-fifth aspect, the invention provides the method of the fifteenth aspect, further comprising tetramethylammonium silicate.

In a twenty-sixth aspect, the invention provides a composition comprising:
a. concentrated phosphoric acid, in an amount of at least 60 weight percent, based on the total weight of the composition;
b. a compound chosen from chosen from linear and branched $C_8$-$C_{16}$ alkylbenzenesulfonic acids and $C_6$-$C_{12}$ alkyldiphenyl oxide disulfonic acids;
c. a compound chosen from:
i. N-(3-trimethoxysilylpropyl)diethylenetriamine;
ii. N-(2-aminoethyl)-3-aminopropyltriethoxy silane;
iii. N-(2-aminoethyl)-3-aminopropyl silane triol;
iv. $N^1$-(3-trimethoxysilylpropyl)diethylenetriamine;
v. N-(6-aminohexyl)aminopropyltrimethoxysilane;
vi. (3-aminopropyl)triethoxy-silane; and
vii. (3-aminopropyl)silane triol; and
d. a compound chosen from tetramethylammonium silicate and tetraethyl orthosilicate.

In a twenty-seventh aspect, the invention provides the composition of the twenty-sixth aspect, further comprising e. 4-(3-phenylpropyl)pyridine.

In a twenty-eighth aspect, the invention provides the composition of the twenty-sixth aspect, wherein the composition comprises (3-aminopropyl)silane triol; tetramethylammonium silicate, phosphoric acid, 4-(3-phenylpropyl)pyridine, dodecylbenzenlsulfonic acid, and 4-octylbenzenesulfonic acid.

In a twenty-ninth aspect, the invention provides a method of etching a silicon nitride surface on a microelectronic device substrate, said substrate comprising a surface comprising polysilicon, the method comprising:
providing a composition comprising:
a. concentrated phosphoric acid, in an amount of at least 60 weight percent, based on the total weight of the composition;
b. a compound chosen from chosen from linear and branched $C_8$-$C_{16}$ alkylbenzenesulfonic acids and $C_6$-$C_{12}$ alkyldiphenyl oxide disulfonic acids;
c. a compound chosen from:
i. N-(3-trimethoxysilylpropyl)diethylenetriamine;
ii. N-(2-aminoethyl)-3-aminopropyltriethoxy silane;
iii. N-(2-aminoethyl)-3-aminopropyl silane triol;
iv. $N^1$-(3-trimethoxysilylpropyl)diethylenetriamine;
v. N-(6-aminohexyl)aminopropyltrimethoxysilane;
vi. (3-aminopropyl)triethoxy-silane; and
vii. (3-aminopropyl)silane triol; and
d. a compound chosen from tetramethylammonium silicate and tetraethyl orthosilicate.

In a thirtieth aspect, the invention provides the method of the twenty-ninth aspect, wherein the composition further comprises 4-(3-phenylpropyl)pyridine In a thirty-first aspect, the invention provides a method of etching a silicon nitride surface on a microelectronic device substrate, said substrate comprising a surface comprising polysilicon, the method comprising:
providing a composition comprising:
(3-aminopropyl)silane triol;
tetramethylammonium silicate;
phosphoric acid;
4-(3-phenylpropyl)pyridine;
dodecylbenzenesulfonic acid; and
4-octylbenzenesulfonic acid;
providing a substrate having a surface comprising silicon nitride and a surface comprising polysilicon, and contacting the substrate with the composition under conditions effective to etch silicon nitride.

In a thirty-second aspect, the invention provides a kit including, in one or more containers, one or more of components a., b., c., d., and/or e., as claimed in any one the first through the fourteenth aspects, or the twenty-sixth or the twenty-eighth aspects.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respects, only illustrative. The disclosure's scope is, of course, defined in the language in which the appended claims are expressed.

What is claimed is:

1. A composition comprising: concentrated phosphoric acid, in an amount of at least 60 weight percent, based on the total weight of the composition; a compound chosen from linear and branched $C_8$-$C_{16}$ alkylbenzenesulfonic acids and $C_6$-$C_{12}$ alkyldiphenyl oxide disulfonic acids; and a compound of the formula Si[phenyl-($-CH_2-$)$_x$]$_n$(OR)$_m$, wherein n is 1, 2, or 3, m is 1, 2, or 3, and the sum of n and m is 4, and x is 0, 1, 2 or 3, and wherein each R is independently chosen from $C_1$-$C_4$ alkyl.

2. The composition of claim 1, wherein each R is methyl.

3. The composition of claim 1, wherein n is 1.

4. The composition of claim 1, wherein the compound chosen from linear and branched $C_8$-$C_{16}$ alkylbenzenesulfonic acids and $C_6$-$C_{12}$ alkyldiphenyl oxide disulfonic acids is chosen from
hexyl diphenyl oxide disulfonic acid;
tetrapropyl-(sulfophenoxy)-benzenesulfonic acid;
dodecylbenzenesulfonic acid; and
4-octylbenzenesulfonic acid.

5. The composition of claim 1, further comprising added silica.

6. The composition of claim 1, further comprising at least one silane chosen from (a) alkylamino alkoxysilanes and (b) alkylamino hydroxyl silanes, wherein the silane possesses at least one moiety chosen from alkoxy and hydroxyl.

7. The composition of claim 1, further comprising a compound chosen from
N-(3-trimethoxysilylpropyl)diethylenetriamine;
N-(2-aminoethyl)-3-aminopropyltriethoxy silane;
N-(2-aminoethyl)-3-aminopropyl silane triol;
N$^1$-(3-trimethoxysilylpropyl)diethylenetriamine;
N-(6-aminohexyl)aminopropyltrimethoxysilane;
(3-aminopropyl)triethoxy-silane; and
(3-aminopropyl)silane triol.

8. The composition of claim 1, further comprising tetramethylammonium silicate and (3-aminopropyl) silane triol.

9. The composition of claim 1, further comprising tetramethylammonium silicate or tetraortho silicate.

10. A composition comprising: concentrated phosphoric acid, in an amount of at least 60 weight percent, based on the total weight of the composition; a compound chosen from linear and branched $C_8$-$C_{16}$ alkylbenzenesulfonic acids and $C_6$-$C_{12}$ alkyldiphenyl oxide disulfonic acids; and a compound of the formula

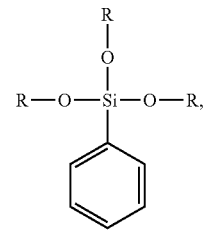

wherein each R is independently chosen from $C_1$-$C_4$ alkyl.

11. The composition of claim 10, wherein each R is methyl.

12. The composition of claim 10, wherein the compound chosen from chosen from linear and branched $C_8$-$C_{16}$ alkylbenzenesulfonic acids and $C_6$-$C_{12}$ alkyldiphenyl oxide disulfonic acids is chosen from
hexyl diphenyl oxide disulfonic acid;
tetrapropyl-(sulfophenoxy)-benzenesulfonic acid;
dodecylbenzenesulfonic acid; and
4-octylbenzenesulfonic acid.

13. The composition of claim 10, further comprising a compound chosen from
N-(3-trimethoxysilylpropyl)diethylenetriamine;
N-(2-aminoethyl)-3-aminopropyltriethoxy silane;
N-(2-aminoethyl)-3-aminopropyl silane triol;
N$^1$-(3-trimethoxysilylpropyl)diethylenetriamine;
N-(6-aminohexyl)aminopropyltrimethoxysilane;
(3-aminopropyl)triethoxy-silane; and
(3-aminopropyl)silane triol.

14. The composition of claim 10, further comprising tetramethylammonium silicate and (3-aminopropyl) silane triol.

* * * * *